United States Patent [19]

Okutsu

[11] Patent Number: 5,504,436
[45] Date of Patent: Apr. 2, 1996

[54] SOCKET APPARATUS FOR MEMBER TESTING

[75] Inventor: Masumi Okutsu, Kanagawa, Japan

[73] Assignee: Sony Corporation, Tokyo, Japan

[21] Appl. No.: 229,786

[22] Filed: Apr. 19, 1994

[30] Foreign Application Priority Data

Apr. 28, 1993 [JP] Japan .................................. 5-124931

[51] Int. Cl.$^6$ ..................................... G01R 31/02
[52] U.S. Cl. ......................... 324/761; 324/754; 324/755; 324/158.1
[58] Field of Search ..................................... 324/754, 761, 324/755, 158.1; 439/68, 69, 70

[56] References Cited

U.S. PATENT DOCUMENTS

| | | | |
|---|---|---|---|
| 4,675,599 | 6/1987 | Jensen et al. | 324/754 |
| 4,689,556 | 8/1987 | Cedrone | 324/761 |
| 5,170,117 | 12/1992 | Chio | 324/755 |

FOREIGN PATENT DOCUMENTS 64-23174   1/1989   Japan .

Primary Examiner—Kenneth A. Wieder
Assistant Examiner—Kourosh Cyrus Khosravi
Attorney, Agent, or Firm—Ronald P. Kananen

[57] ABSTRACT

A testing socket apparatus is provided for testing a plurality of different kinds of semiconductors without deformation of their leads. The testing socket apparatus includes a movable base which is movable up and down above a base and a loading portion which is substantially centrally provided on the movable base and on which the semiconductor device is loaded. A tip end of each of testers extends upwardly from a periphery of the loading portion. The tip end of each of the testers is brought into contact with an outer surface of the associated lead by lowering the movable base. The testers may be provided through guide holes formed in the movable base or may be biased toward the loading portion. Also, each of the testers may be formed substantially in L-shape to provide a pivot point at its corner whereby movement about the pivot point brings the testers into contact with the outer surface of the leads.

4 Claims, 5 Drawing Sheets

SOCKET APPARATUS FOR MEMBER TESTING

BACKGROUND OF THE INVENTION

1. Field of the Invention

The present invention relates to a testing socket apparatus for measuring electric characteristics of a semiconductor device by obtaining a contact with leads extending from a package.

2. Description of the Related Art

In order to measure electric characteristics of a semiconductor device having leads extending from side walls of its package, a testing socket is used to obtain the electric connection between the semiconductor device which is an object to be tested and a testing circuit substrate.

FIG. 1 is a cross-sectional view illustrating a conventional testing socket shown in Japanese Patent Application Laid-Open No. Sho 64-23174.

Namely, in the testing socket apparatus 1, a pair of testers 4 are provided in one-to-one relation with leads 6 of a semiconductor device 7, which is an object to be tested, in a receiving space defined by a substrate 2.

In order to conduct a test of the semiconductor device 7 by using the testing socket apparatus 1, the testers 4 which extend downwardly from the testing socket apparatus 1 are inserted in advance into a circuit substrate (not shown) to fasten the testing socket apparatus thereto.

Under this condition, first of all, the semiconductor device 7 is loaded onto a loading portion 8, and a suspension 5 which holds the loading portion 8 is lowered.

Thus, a reactive force of the testers 4 is applied to the leads 6 of the semiconductor device 7 to generate a constant pressure therebetween and to obtain an electric connection between the circuit substrate (not shown) and the semiconductor device 7.

Then, a predetermined signal is fed from the circuit substrate through the pair of testers to the semiconductor device 7, and an output signal fed from the semiconductor device 7 in response to the predetermined signal is returned again through the testers 4 back to the circuit substrate to thereby conduct the electric measurement based upon the output signal.

When the measurement has been completed, the suspension 5 is raised and the semiconductor device 7 is removed from between the pair of the testers 4.

However, such a testing socket apparatus suffers from the following problems.

Namely, the semiconductor device is pressed and inserted between the pair of testers in order to ensure the contact between the leads extending from the semiconductor device and the testers of the testing socket.

For this reason, it is possible to apply the testing system to a case where the leads are J-shaped (bent toward the inside of the package) but there is a problem that the leads may be pressed in an undesirable manner so as to cause deformation of the leads in the case of other lead shapes, for example, in the case where the leads are of a gull wing configuration for "surface loading" (i.e., the tip ends of the leads are bent outwardly from the package).

In particular, the prior art device may cause undesirable deformation in a semiconductor device having a plurality of leads of fine pitch in which an interval between the adjacent leads is small, and the mechanical strength is low.

Also, since the interval between the pair of testers is kept constant, it is necessary to provide different testing sockets in conformity with the size of semiconductor device to be tested.

SUMMARY OF THE INVENTION

According to the present invention, there is provided a testing socket apparatus in which a package containing an electronic component is loaded with its upper surface directed downwardly for contact with an outer surface each of lead which extends substantially horizontally from a side wall of the package and bends substantially vertically to thereby measure the electric characteristics of the component, the apparatus comprising: a movable base mounted to move up and down on posts provided on a base, the movable base being biased upwardly by a spring force; a loading portion provided centrally of the movable base for loading the electronic component; and testers, each of which has a tip end extending upwardly from a periphery of the loading portion and adapted to move inwardly of the loading portion in correspondence with the lowering of the movable base on which the electronic component is loaded, for obtaining contact with the outer surface of each of the leads.

The testers may be provided through guide holes formed in the movable base whereby the range of movement of the testers, by the lowering movement of the movable base, is restricted by the guide holes. Otherwise, the testers may be biased toward the loading portion.

Also, each of the testers may comprise an upper extending portion and a side extending portion to form substantially an L-shape, so that the side extending portion is lowered and the testers are moved about a pivot point which is a substantially L-shaped corner portion of the L-shape by the lowering movement of the movable base.

The tip ends of the testers extend from the periphery of the loading portion of the semiconductor device loaded on the movable base and are moved inwardly toward the loading portion by the lowering movement of the movable base. Namely, under the condition that the semiconductor device is loaded on the loading portion, the tip ends of the testers are located outside of the leads extending in the right and left directions of the package and are moved inwardly in correspondence with the lowering movement of the movable base to be brought into contact with the substantially vertical outer surfaces of the leads. For this reason, it is possible to obtain the contact pressure between the testers and the leads in correspondence with the lowering movement of the movable base.

Also, by causing the testers to pass through the guide holes formed in the movable base, it is possible to insure the movement of the testers within a predetermined range.

In addition, if the testers are substantially of an L-shape and are pivoted about the corner of the L-shape by the lowering movement of the movable base, it is possible to control the movement of the testers in correspondence with the lowering movement of the movable base in conformity with the intervals of the adjacent leads of the semiconductor device.

DESCRIPTION OF THE PREFERRED EMBODIMENTS

A testing socket apparatus for a semiconductor device according to the invention will now be described with reference to the accompanying drawings.

Figure 1:
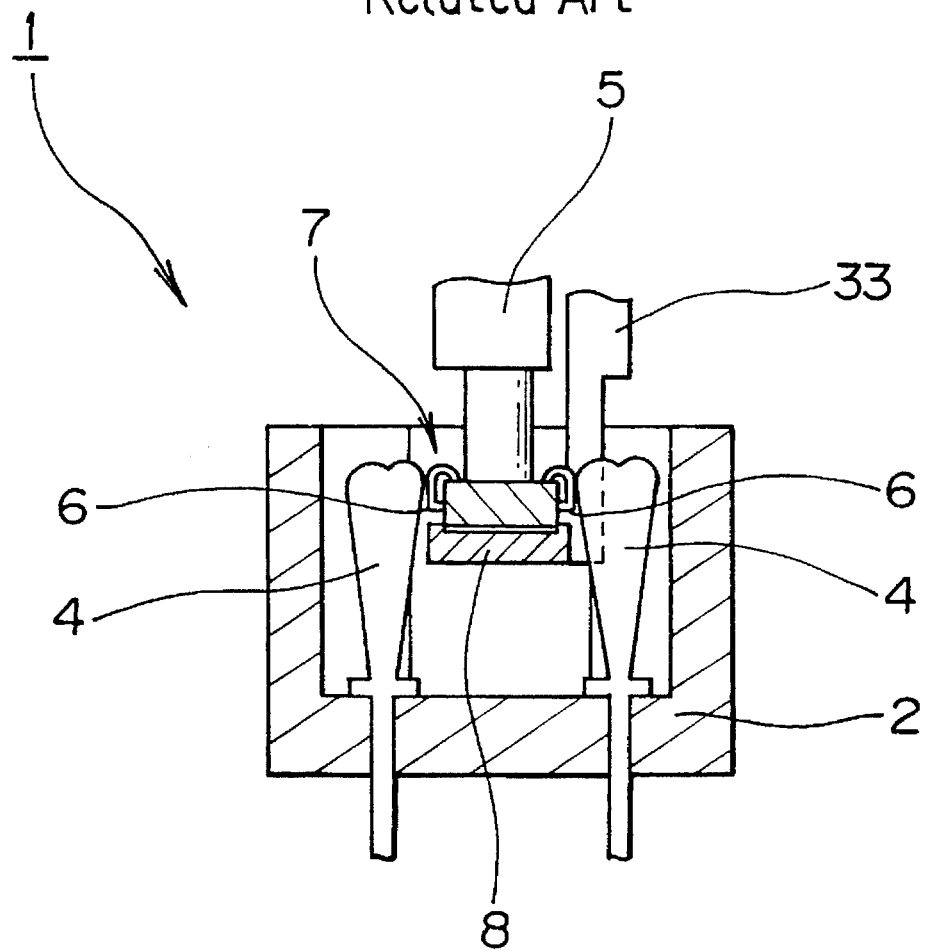
FIG. 1 is a cross-sectional view illustrating a conventional testing socket apparatus for a semiconductor device.
Figure 2:
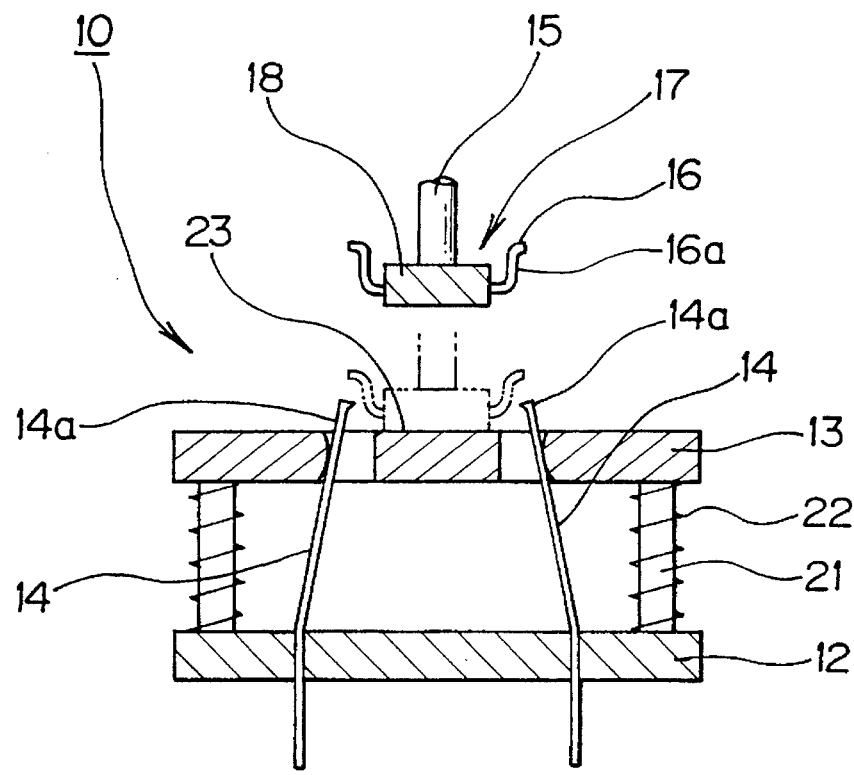
FIG. 2 is a cross-sectional view illustrating a testing socket apparatus for a semiconductor device according to a first embodiment of the invention.

FIG. 2 is a cross-sectional view showing a testing socket apparatus in accordance with a first embodiment of the invention.

Namely, the testing socket apparatus 10 is used to obtain an electrical connection with leads 16 extending from a package 18 of a semiconductor device 17 and is loaded on a testing circuit substrate by means of a for conducting a predetermined measurement by means of a conductive connection between the semiconductor device 17 and the circuit substrate.

The testing socket apparatus 10 includes a base 12 having posts 21, a movable base 13 which is mounted movably through the posts 21 and is urged upwardly by forces of springs 22, a loading portion 23 formed in the central portion of the movable base 13, and testers 14 having tip ends 14a and extending upwardly from peripheries of the loading portion 23.

Incidentally, in the accompanying drawings, only a pair of leads 16 and the associated two testers 14 are shown but in the case where a number of leads 16 are provided, testers corresponding to the number of the leads 16 are also provided.

In order to obtain the contact between the leads 16 of the semiconductor device 17 and the testers 14 of the testing socket apparatus 10, the semiconductor device 17 is loaded on the loading portion 23 of the movable base 13 with the semiconductor device 17 being kept up side down. Namely, the top surface of the package 18 is directed downwardly and hence, the extending leads 16 are directed upwardly.

For loading the semiconductor device in place, the semiconductor device 17 is held by using, for example, a suction nozzle 15. The semiconductor device 17 is arranged above the loading portion 23 and lowered from that position.

After the semiconductor device 17 has been laid on the loading portion 23 with its top side down, the semiconductor device 17 is further lowered by using the suction nozzle 15 or the movable base 13 is further lowered by using other mechanisms (not shown).

The lowering movement causes the movable base 13 to be moved downwardly along the posts 21 so that the testers 14 are pressed with their ends 14a moving inwardly of the loading portion 23.

Figure 3:
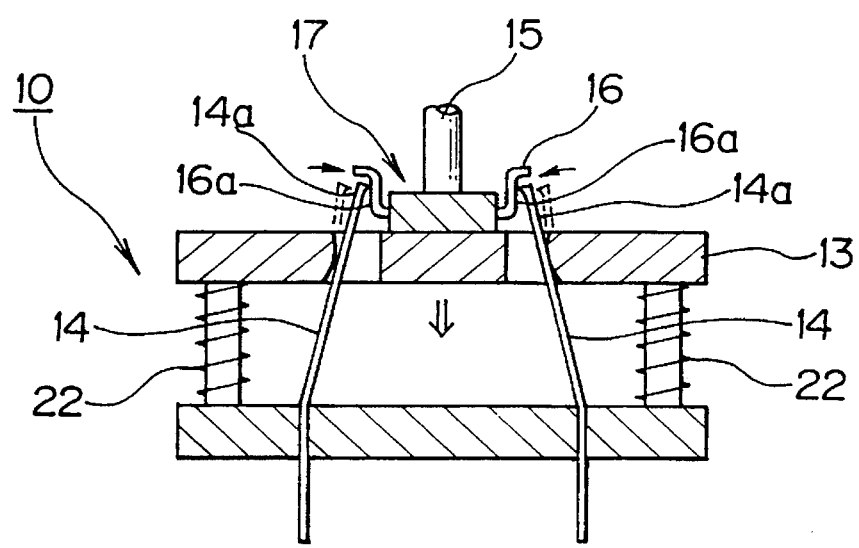
FIG. 3 is a cross-sectional view illustrating a contact condition of the testing socket apparatus shown in FIG. 2.

The predetermined lowering movement of the movable base 13 causes the ends 14a of the testers 14 to come into contact with substantially vertical outer surfaces 16a of the leads 16 as shown in cross section of FIG. 3.

Since it is possible to adjust the contact pressure in correspondence with the lowering movement of the movable base 13 by the movement of the leads, it is possible to avoid unduly deforming of the leads 16.

Under the condition that the contact is insured between the leads 16 of the semiconductor device 17 and the testers 14 of the testing socket 10, a predetermined signal is fed from the above-described circuit substrate (not shown) and transferred to the semiconductor device 17 through the testers 14 and the leads 16 to thereby operate the semiconductor device 17.

An output signal corresponding to this operation is returned from the leads 16 of the semiconductor device 17 through the testers 14 to the circuit substrate. On the basis of the output signal, the electric characteristics of the semiconductor device 17 are measured.

Upon the completion of the measurement, the suction nozzle 15 is raised so that the movable base 3 is raised by the force of the springs 22 or the base 3 is raised by the other mechanisms.

Since the testers 14 have elasticity in advance, the tip ends 14a of the testers 14 are moved outwardly of the loading portion 23 and separated away from the outer surfaces 16a of the leads by the ascending motion of the movable base 13.

Therefore, it is possible to remove the semiconductor device 17 from the loading portion 23 and to place a next semiconductor device on the loading portion 23.

With such serial operation, the tip ends 14a of the testers 14 and the outer surfaces 16a of the leads 16 of the semiconductor device 17 to be tested may be brought into contact at a predetermined contact pressure.

If any type of the semiconductor device 17 has the lead outer surfaces 16a which extend from the side walls of the package 18 and bend substantially vertically, it is possible to obtain the contact between the leads 16 and the testers 14.

Figure 4A:
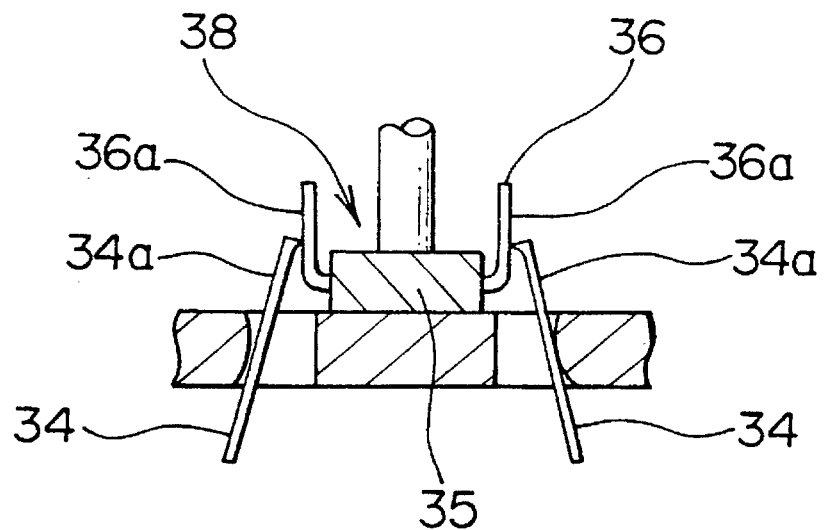
FIGS. 4A and 4B are cross-sectional views showing the contact conditions with other shapes of the leads, illustrating an insertion type and a J-shaped type, respectively.
Figure 4B:
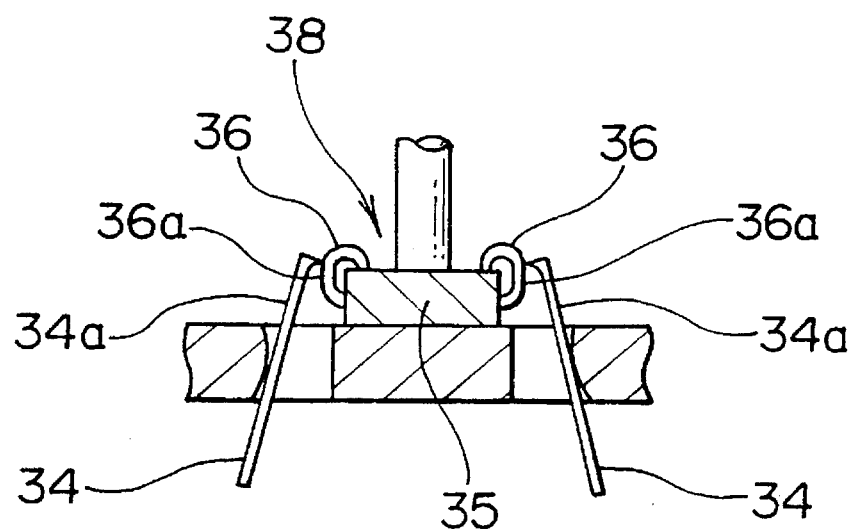

FIGS. 4A and 4B are cross-sectional views showing the contact conditions of other type leads. FIG. 4A shows an insertion type and FIG. 4B shows J-shaped leads.

The semiconductor device 38 provided with leads 36 as shown in FIG. 4A typically includes a dual in-line package (DIP), for example. In such insertion type leads 36, since the outer surfaces 36a are long, it is possible to keep a sufficient contact between the tip ends 34a of the testers 34 and the outer surfaces 36a of the leads 36 even if the thickness of the package 35 is varied within some range.

Also, as shown in FIG. 4B, even if the tip ends of the leads 36 are J-shaped and bent toward the inside of the package 35, since a substantially vertical outer surface 36a is present in the leads 36 which extend from the package 35, it is possible to maintain a contact between the ends 94a of the testers 34 and the outer surfaces 36a of the leads 36.

A second embodiment of the invention will be described with reference to FIG. 5.

Figure 5:
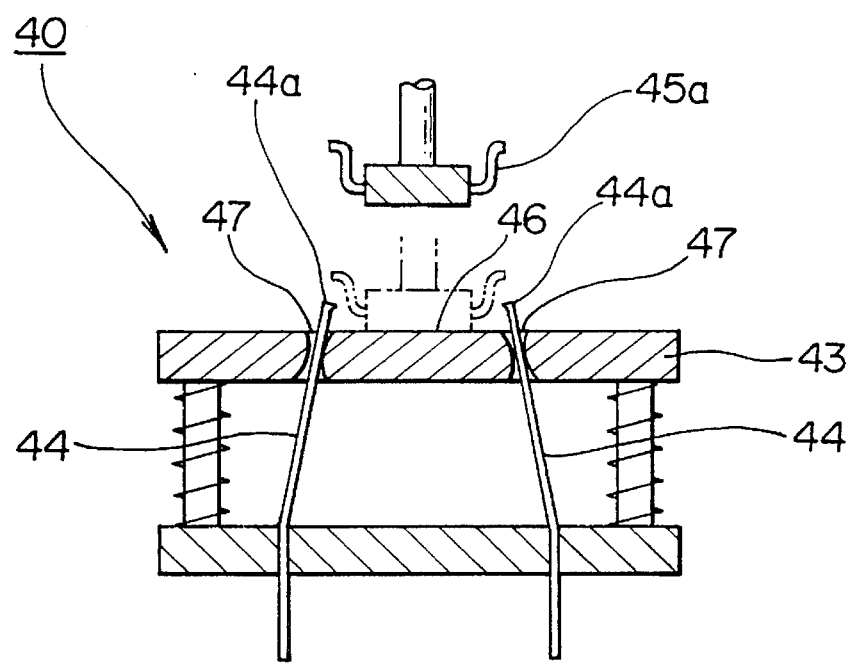
FIG. 5 is a cross-sectional view illustrating a testing socket apparatus for a semiconductor device according to a second embodiment of the invention.

In the testing socket apparatus shown in FIG. 5, guide holes 47 are formed around the periphery of the loading portion 46 of the movable base 43, and the testers 44 are inserted into the guide holes 47. Namely, the testers 44 are positioned by the guide holders 47 and the movement range of the testers 44 is defined by the vertical movement of the movable base 43. For this reason, in the case where, the movable base 43 is lowered, the testers 44 are moved inwardly of the loading portion 46 with the ends 44b in contact with the outer lead surfaces 45a, and in the case where the movable base 43 is raised upwardly, the testers 44 are moved outwardly in correspondence with the upward movement. Namely, even if the testers 44 are not elastic, it is possible to perform the forcible return movement (i.e., return of the testers 44 to a desired position).

Figure 6:
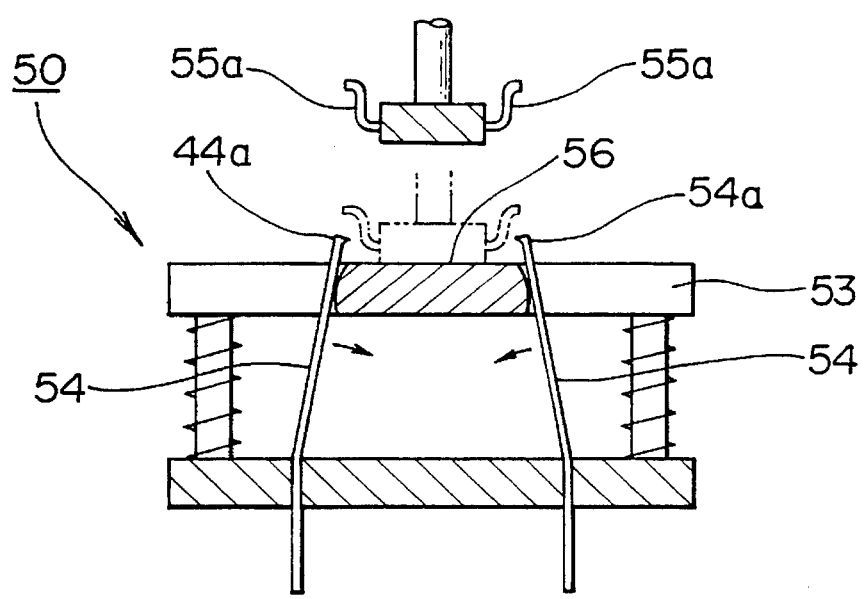
FIG. 6 is a cross-sectional view illustrating a testing socket apparatus for a semiconductor device according to a third embodiment of the invention.

In a testing socket apparatus 50 according to a third embodiment shown in FIG. 6, spring elasticity is imparted in advance to the testers 54 so that the testers 54 are urged inwardly toward the loading portion 56. In the case where the movable base 53 is raised upwardly, the testers 54 are brought into contact with the side surfaces of the loading portion 56.

For this reason, by lowering the movable base 53, the contact position is changed, and the spring elasticity of the testers 54 causes their tip ends 54a to move inwardly toward the loading portion 56 to come into contact with the outer lead surfaces 55a.

Figure 7:
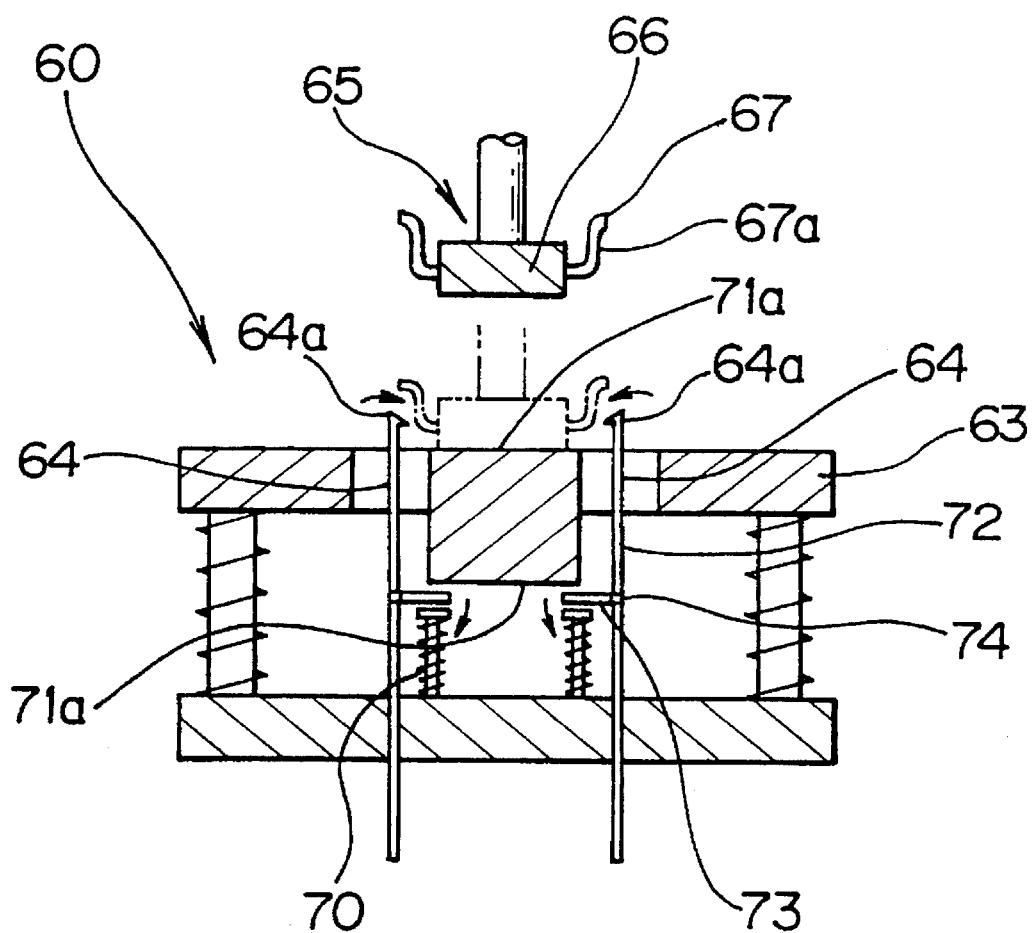
FIG. 7 is a cross-sectional view illustrating a testing socket apparatus for a semiconductor device according to a fourth embodiment of the invention.

Next, in a testing socket apparatus 60 according to a fourth embodiment shown in FIG. 7, substantially L-shaped testers 64 each of which is composed of an upper extending portion 72 and a side extending portion 73. Each of the testers 64 is movable about a pivot point 74 which is a substantially L-shaped corner. Namely, a lower surface of the loading portion 71 extends downwardly to form a pressure surface 71a. When the movable base 63 is lowered, the pressure surface 71a presses the side extending portions 73 of the testers 64.

When the side extending portions 73 are lowered, the upper extending portion 72 are moved inwardly about the pivot points 74 toward the loading portion 71 so that the tip ends 64a are brought into contact with the outer surfaces 67a of the leads 67.

Springs 70 are provided below the side extending portions 73 so that the side extending portions 73 are biased upwardly. Accordingly, when the pressure surface 71a is raised upwardly, the force of the springs 70 causes the side extending portions 73 to move upwardly. In association with this movement, the upper extending portion 72 move outwardly and the tip ends 64a of the testers 64 are separated away from the outer lead surfaces 67a.

Thus, in such a testing socket apparatus 60, by changing a height of the pressure surface 71a, it is possible to change the contact position of the tip ends 64a relative to the lowering movement of the movable base 63.

The higher the position of the pressure surface 71a becomes, the longer the contact distance up to the side extending portions 73 will be. Thus, unless the movable base 63 is sufficiently lowered, it is impossible to obtain the contact between the tip ends 64a and the outer lead surfaces 67a. The testers 64 are brought into contact with portions of the leads 67 which are close to their tip ends.

Inversely, if the pressure surface 71a is lowered, by only somewhat lowering the movable base 63, it is possible to insure contact between the tip ends 64a and the outer lead surfaces 67a so that the tester ends 64a are brought into contact with portions of the leads 67 which are close to the package 66.

Thus, by adjusting the contact position of the tip ends 64a, it is possible to adjust the contact position between the testers 64 and the tip ends 64a in correspondence with the thickness of the package 66 and the shape of the leads 67.

Also, in any embodiment, ribs or recesses (not shown) may be provided on a top surface of the loading portion for position alignment for the package of the semiconductor device to be laid on the loading portion.

As described above, the testing socket apparatus for semiconductor devices according to the invention has the following advantages.

Namely, since the contact pressure between the tip ends of the testers and the outer lead surfaces may be adjusted in correspondence with the amount of the lowering movement of the movable base, it is possible to avoid any deformation of the leads.

In addition, since the testers are moved to come into contact with the outer lead surfaces, the present invention may be effectively applied to a semiconductor device having any type of leads which have outer lead surfaces.

Also, since the semiconductor device is laid on the loading portion with a pair of testers being opened and the testers being moved inwardly to come into contact with the outer lead surfaces by the lowering movement of the movable base, the invention may be effectively applied to cases where intervals between adjacent testers on each side is somewhat different from each other.

Furthermore, by adjusting the contact position of the testers, it is possible to insure the contact between the testers and leads even if the thickness of the packages varies and/or the shape of the leads varies.

As has been described above, the testing socket apparatus according to the invention may be effectively applied in particular to the measurement in the case where the semiconductor device has a fine pitch of the leads and/or various kinds and a small number of the semiconductor devices are to be produced.

What is claimed is:

1. A testing socket apparatus for testing a package containing an electronic component, said package having an upper surface, side walls, and leads outwardly extending from said side walls and having an outer surface, and wherein said package is adapted to be loaded onto said apparatus with said upper surface directed downwardly with the outer surface of each of said leads having a portion extending substantially vertically, said apparatus comprising:

a base member having an upstanding member extending therefrom;

a generally planar, movable member supported on said upstanding member for movement up and down relative to said base member, said movable member being biased in its up position;

a loading portion on said movable member for receiving said electronic component thereon;

a plurality of testing members, each of said testing members having a tip end extending upwardly about a periphery of said loading portion; and means for moving said tip ends inwardly of the periphery of said loading portion as the movable member on which said electronic component is loaded is moved downwardly to thereby establish an electrical contact between the substantially vertical outer surface of each of said leads and a respective tip end of said testing members.

2. The testing socket apparatus according to claim 1, wherein said movable member includes guide holes and said testing members extend through said guide holes and wherein a range of movement of said testing members as said movable member is lowered is restricted by said guide holes.

3. The testing socket apparatus according to claim 1, wherein said testing members are biased to urge said tip ends toward said loading portion.

4. The testing socket apparatus according to claim 1, wherein each of said testing members comprises an upper extending portion and a side extending portion thereby forming a substantially L-shaped member mounted to pivot about the corner of said L-shape, said side extending portion extending to a position beneath said movable member whereby said side extending portions are contacted by said movable member as said movable member is lowered from its raised position to thereby urge said ends towards the outer surface of said leads.

* * * * *